US006432256B1

(12) United States Patent
Raoux

(10) Patent No.: US 6,432,256 B1
(45) Date of Patent: Aug. 13, 2002

(54) IMPLANATATION PROCESS FOR IMPROVING CERAMIC RESISTANCE TO CORROSION

(75) Inventor: Sébastien Raoux, San Francisco, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 09/258,038

(22) Filed: Feb. 25, 1999

(51) Int. Cl.$^7$ .............................. H05H 1/00; C23C 16/00
(52) U.S. Cl. .............................. 156/345.1; 156/345.51; 118/715; 118/716; 118/728; 118/725
(58) Field of Search .............................. 118/715, 728, 118/725; 204/298.05; 427/529, 530; 156/345; 134/1

(56) References Cited

U.S. PATENT DOCUMENTS

| | | | | |
|---|---|---|---|---|
| 4,461,799 A | * | 7/1984 | Gavrilov et al. | 204/298.05 |
| 5,126,163 A | * | 6/1992 | Chan | 427/531 |
| 5,328,556 A | * | 7/1994 | Matlow | 438/5 |
| 5,443,789 A | * | 8/1995 | Harris et al. | 420/443 |
| 5,705,080 A | * | 1/1998 | Leung et al. | 216/67 |
| 5,748,434 A | * | 5/1998 | Rossman et al. | 361/234 |
| 5,794,838 A | * | 8/1998 | Ushikoshi et al. | 228/121 |
| 5,810,936 A | * | 9/1998 | Leung et al. | 118/728 |
| 5,841,236 A | * | 11/1998 | Brown et al. | 315/111.41 |
| 6,123,791 A | * | 9/2000 | Han et al. | 156/345 |
| 6,139,983 A | | 10/2000 | Ohashi et al. | 428/698 |
| 6,143,078 A | * | 11/2000 | Ishikawa et al. | 118/715 |
| 6,215,643 B1 | * | 4/2001 | Nagasaki | 361/234 |
| 6,352,611 B1 | * | 3/2002 | Han et al. | 156/345 |

FOREIGN PATENT DOCUMENTS

| | | | |
|---|---|---|---|
| JP | 62-171976 | * | 7/1987 |
| JP | 8-74036 | * | 3/1996 |

OTHER PUBLICATIONS

Patent application No. 2001/0003271A1, Jun.–2001, Otsuki.*

* cited by examiner

Primary Examiner—Gregory Mills
Assistant Examiner—P. Hassanzadeh
(74) Attorney, Agent, or Firm—Townsend & Townsend & Crew

(57) ABSTRACT

A method for improving the corrosion resistance of ceramic parts in a substrate processing chamber by implanting the parts with rare-earth ions. The implanted ceramic parts are highly resistant to corrosive environments that can be formed in semiconductor manufacturing equipment including those found in high temperature applications and high density plasma applications. In a preferred embodiment of the method of the present invention, the ceramic parts are implanted with rare-earth ions using an implantation technique based on a metal vapor vacuum arc (MEVVA™) ion source. The implanted ions are then reacted with fluorine radicals in a highly corrosive environment to form a layer of rare-earth fluoride material, RE:$F_3$, at the surface of the ceramic component. The sublimation temperature of such a RE:$F_3$ layer is much higher than that of layers such as $AlF_3$ that are formed on standard ceramic chamber components in such environments (e.g., up to 1100° C. as compared to 600° C.). At substrate processing temperatures less than the sublimation temperature, the formed RE:$F_3$ layer acts as a passivation layer preventing consumption of the ceramic part during further substrate processing. A substrate processing chamber including at least one component implanted with rare-earth ions is provided. In various specific embodiments, the rare-earth-ion-implanted ceramic component is one or more of a chamber liner, a chamber dome, a cover plate, a gas manifold or faceplate and/or a substrate holder, such as a high temperature heater or an electrostatic chuck.

25 Claims, 7 Drawing Sheets

IMPLANATATION PROCESS FOR IMPROVING CERAMIC RESISTANCE TO CORROSION

BACKGROUND OF THE INVENTION

The present invention relates to the semiconductor manufacturing equipment. More specifically, the present invention relates to the implantation of rare-earth ions into ceramic materials and using the implanted material for selected ceramic components of such semiconductor manufacturing equipment.

Because of their physical characteristics, ceramic materials are commonly used in today's semiconductor manufacturing equipment to meet the high standards of process performance demanded by integrated circuit manufacturers. Ceramic materials present higher resistance to corrosion, help increasing process kit lifetimes and lower the cost of consumables as compared to materials such as aluminum or quartz which have been commonly used in the past. Some common components that can be advantageously manufactured from ceramic materials include chamber domes for inductively coupled reactors, edge rings used to confine deposition gases to the upper surface of a substrate in some processing chambers and chamber liners that protect the walls from direct contact with a plasma formed within the chamber and improve plasma confinement by reducing the coupling of a plasma with conductive chamber walls. Ceramic materials are also used for critical components, such as high temperature heaters and electrostatic chucks among others.

While the particle generation caused by aging and corrosion is much improved for ceramic parts as compared to anodized or coated parts, it remains a critical problem for high temperature applications (e.g., applications where processing temperatures are greater than 550° C.). Indeed, the corrosion of $Al_2O_3$ and AlN ceramics in highly corrosive fluorine and chlorine environments may result in the formation of AlO:F, $AlF_x$ and $AlCl_x$ films at the surface of the ceramic component. These films have relatively high vapor pressures and relatively low sublimation temperatures (e.g., the sublimation temperature of aluminum chloride is approximately 350° C. and the sublimation temperature of aluminum fluoride is approximately 600° C.) and can attain thicknesses of several hundred micrometers when conditions for self-passivation are not met. If a particular ceramic component (e.g., heater, electrostatic chuck, cover plate, etc.) is used above the sublimation temperature, the outer surface of the component is consumed during the process in which the AlO:F, $AlF_x$ or $AlCl_x$ film is formed. Furthermore, it has been observed, that under ion bombardment, an AlF film can be sputtered, even at temperatures less than 400° C. This phenomenon may result in recondensation of the byproducts on colder components (e.g., showerheads and chamber liners) and may lead to process drift and particle contamination in some substrate processing chambers.

With the development of high density plasma sources, the development of 300 mm-wafer-size reactors and the growing importance of certain high temperature processing steps, the wear of chamber materials and its impact on the tool performance and productivity are challenged. Specifically, the interaction of corrosive plasmas and reactor materials become of critical importance to the development of future product lines of semiconductor manufacturing equipment. Very harsh environments (e.g., $NF_3$, $C_2F_6$, $C_3F_3$, $ClF_3$, $CF_4$, $SiH_4$, TEOS, $WF_6$, $NH_3$, HBr, etc.) can be found in plasma etchers and plasma-enhanced deposition reactors. Constituents from many of these environments may react with and corrode ceramic materials such as aluminum nitride and aluminum oxide. Therefore, the combination of long plasma exposure times, high temperature processes and high plasma densities are revealing problems never encountered.

In light of the above, improvements in the corrosion resistance of various substrate processing chamber parts and components are desirable. Ideally, critical ceramic parts, such as high temperature heaters (heaters for use at temperatures greater than 550° C.) and electrostatic chucks (ESC), should have a lifetime of at least one year on a production tool. Depending on the tool chamber, this can correspond to processing 50,000 wafers or more without having to change any parts of the tool (i.e., a zero consumable situation) while maintaining high standards of process performance. For example, to meet some manufacturer's requirements, the number of particles added on the wafer during the deposition of certain dielectric films must be less than 20 at a particle size of greater than 0.2 $\mu$m.

SUMMARY OF THE INVENTION

The present invention provides a method for improving the corrosion resistance of critical ceramic parts by implanting the parts with rare-earth ions. The implanted ceramic parts are highly resistant to corrosive environments that can be formed in semiconductor manufacturing equipment including those found in high temperature applications and high density plasma applications.

In a preferred embodiment of the method of the present invention, the ceramic parts are implanted with rare-earth ions using an implantation technique based on a metal vapor vacuum arc (MEVVA™) ion source. The MEVVA™ source provides very high ion beam current (up to several amperes) for rapid, industrially-scalable, ceramic parts surface treatment. Rare earth (RE) ions are used for implantation because during substrate processing in a highly corrosive environment a rare-earth fluoride material, $RE:F_3$, may form at the surface of the ceramic component. The sublimation temperature of such a $RE:F_3$ layer is much higher than that of layers such as $AlF_3$ that are formed on standard ceramic chamber components (e.g., up to 1100° C. as compared to 600° C.). At substrate processing temperatures less than the sublimation temperature, the formed $RE:F_3$ layer acts as a passivation layer preventing consumption of the ceramic part during further substrate processing.

According to the apparatus of the present invention, a substrate processing chamber including at least one component implanted with rare-earth ions is provided. In various specific embodiments, the rare-earth-ion-implanted ceramic component is one or more of a chamber liner, a chamber dome, a cover plate, a gas manifold or faceplate and/or a substrate holder, such as a high temperature heater or an electrostatic chuck.

These and other embodiments of the present invention, as well as its advantages and features, are described in more detail in conjunction with the text below and attached figures.

DESCRIPTION OF THE SPECIFIC EMBODIMENTS

I. Exemplary Substrate Processing Chambers

Figure 1:
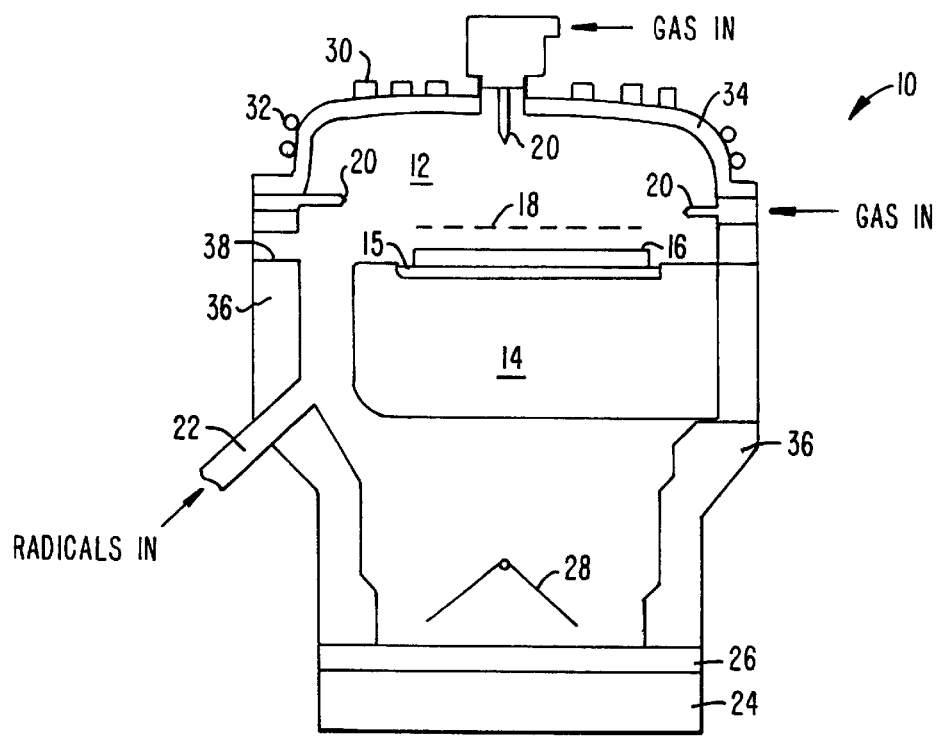
FIG. 1 is a simplified cross-sectional view of an exemplary substrate processing chamber in which ceramic components made according to the method of the present invention may be employed.
Figure 2:
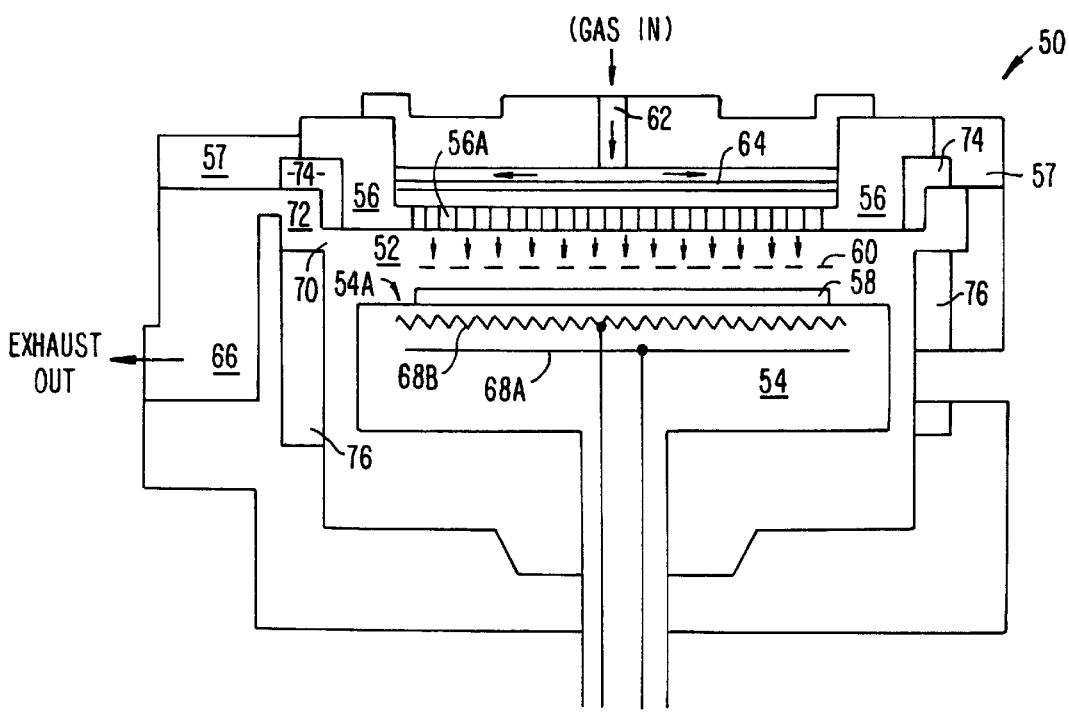
FIG. 2 is a simplified cross-sectional view of a second exemplary substrate processing chamber in which ceramic components made according to the method of the present invention may be employed.

FIGS. 1 and 2 are simplified cross-sectional views of exemplary substrate processing chambers in which ceramic components made according to the method of the present invention may be employed. FIG. 1 is a simplified cross-sectional view of a high density plasma chemical vapor deposition chamber (HDP-CVD) 10 such as an Ultima HDP-CVD substrate processing chamber manufactured by Applied Materials, the assignee of the present invention. In FIG. 1, substrate processing chamber 10 includes a vacuum chamber 12 in which a substrate support 14 is housed. Substrate support 14 includes an electrostatic chuck 15 that securely clamps the substrate 16 to support 14 during substrate processing.

When substrate support 14 is in a processing position (indicated by dotted line 18), deposition and carrier gases are flowed into chamber 10 via gas injection nozzles 20. Nozzles 20 receive gases through gas supply lines, which are not shown. Chamber 10 can be cleaned by the introduction of fluorine radicals or other etchant radicals that are dissociated in a remote microwave plasma chamber (not shown) and delivered to chamber 10 through a gas feed port 22. Unreacted gases and reaction byproducts are exhausted from the chamber 10 by a pump 24 through an exhaust port on the bottom of the chamber. Pump 24 can be isolated from chamber 10 by a gate valve 26.

The rate at which deposition, carrier and clean gases are supplied to chamber 10 is controlled by a mass flow controllers and valves (not shown), which are in turn controlled by computer processor (not shown). Similarly, the rate at which gases are exhausted from the chamber is controlled by a throttle valve 28 and gate valve 26, which are also controlled by the computer processor.

A plasma can be formed from gases introduced into chamber 10 by application of RF energy to independently controlled top coil 30 and side coil 32. Coils 30 and 32 are mounted on a chamber dome 34, which defines the upper boundary of vacuum chamber 12. The lower boundary of vacuum chamber 12 is defined by chamber walls 36. Substrates can be loaded into chamber 10 and onto chuck 15 through an opening 38 in chamber wall 36.

According to the present invention, any or all of electrostatic chuck 15, gas nozzles 20, chamber dome 34 may be constructed from a ceramic material implanted with rare-earth ions according to the present invention.

FIG. 2 is a simplified cross-sectional view of a capacitively-coupled plasma enhanced chemical vapor deposition chamber (PECVD) 50 such as the CxZ CVD substrate processing chamber manufactured by Applied Materials, the assignee of the present invention. In FIG. 2, substrate processing chamber 50 includes a vacuum chamber 52 in which a heated pedestal 54 and a gas distribution manifold 56 are housed. During processing, a substrate 58 (e.g., a semiconductor wafer) is positioned on a flat or slightly convex surface 54A of pedestal 54. The pedestal can be controllably moved between a substrate loading position (depicted in FIG. 2) and a substrate processing position (indicated by dashed line 60 in FIG. 2), which is closely adjacent to manifold 56.

Deposition, carrier and cleaning gases are introduced into chamber 52 through perforated holes 56A of a gas distribution faceplate portion of manifold 56. More specifically, gases input from external gas sources (not shown) flow into the chamber through the inlet 62 of manifold 56, through a conventional perforated blocker plate 64 and then through holes 56A of the gas distribution faceplate. Gases are exhausted from chamber 52 through an annular, slot-shaped orifice 70 surrounding the reaction region and then into an annulate exhaust plenum 72. Exhaust plenum 72 and slot-shaped orifice 70 are defined by ceramic chamber liners 74 and 76 and by the bottom of chamber lid 57.

The rate at which deposition, carrier and clean gases are supplied to chamber 50 is controlled by mass flow controllers and valves (not shown), which are in turn controlled by computer processor (not shown). Similarly, the rate at which gases are exhausted from the chamber is controlled by a throttle valve (not shown and also controlled by the computer processor) connected to exhaust port 66, which is fluidly-coupled to exhaust plenum 72.

The deposition process in chamber 50 can be either a thermal or a plasma-enhanced process. In a plasma-enhanced process, an RF power supply (not shown) provides electrical energy between the gas distribution faceplate and an electrode 68A within pedestal 54 so as to excite the process gas mixture to form a plasma within the generally cylindrical region between the faceplate and pedestal. In either a thermal or a plasma process, substrate 58 can be heated by a heating element 68B within pedestal 54.

According to the present invention, any or all of pedestal 54, gas distribution manifold 56, and chamber liners 74 and 76 may be constructed from a ceramic material implanted with rare-earth ions according to the present invention. The embodiments of FIGS. 1 and 2 are for exemplary purposes only, however. A person of skill in the art will recognize that other types of ceramic parts in these and other types of substrate processing chambers in which highly corrosive environments are contained (e.g., reactive ion etchers, electron cyclotron resonance plasma chambers, etc.) may benefit from the teaching of the present invention.

II. Implantation Process

According to the present invention, ceramic components such as electrostatic chuck 15, gas nozzles 20, chamber dome 34, heated pedestal 54, gas distribution manifold 56, chamber liners 74 and 76, and others may be ion implanted with rare-earth ions in order to improve the resistance of the components to harsh environments including highly corrosive plasma environments and high temperature deposition environments that include corrosive gases. Implantation of the rare-earth ions is done using techniques that are very different from typical semiconductor doping processes and can be done using broad beam energetic ion implantation techniques, metal plasma immersion techniques, high energy ion mixing techniques or similar high energy, high dose implantation techniques. The doses of implantation in these systems are orders of magnitude higher (e.g., $5 \times 10^{15}$ to $10^{17}$ ions/cm$^2$) than those of standard ion implanters and thus allow the implanted material to reach a non-stoichiometric condition after implantation. In a non-stoichiometric condition, most of the implanted species are in interstitial positions and are thus prone to reaction after exposure to high temperature in a corrosive environment. This is a desirable and important characteristic of the present invention as the implanted species react with ions and radicals in the corrosive environment to form a "new" material at the surface of the component as described below. Prior to using a chamber that includes rare-earth ion implanted components according to some embodiments of the present invention, a corrosive environment is formed inside the chamber to form the new material (RE:F$_3$) as part of a seasoning sequence prior to employing the chamber in the production of integrated circuits. In other embodiments, however, no such seasoning step is used and instead the RE:F$_3$ reaction occurs during the first few hours of chamber operation.

According to one embodiment of the present invention, ceramic parts to be implanted with rare-earth ions are placed in a metal vapor vacuum arc (MEVVA™) ion implanter where intense energetic beams of rare-earth metal ions are produced using a metal vacuum arc as the plasma discharge from which the ion beam is formed. Such a MEVVA™ implanter is a cathodic arc plasma source.

Figure 3:
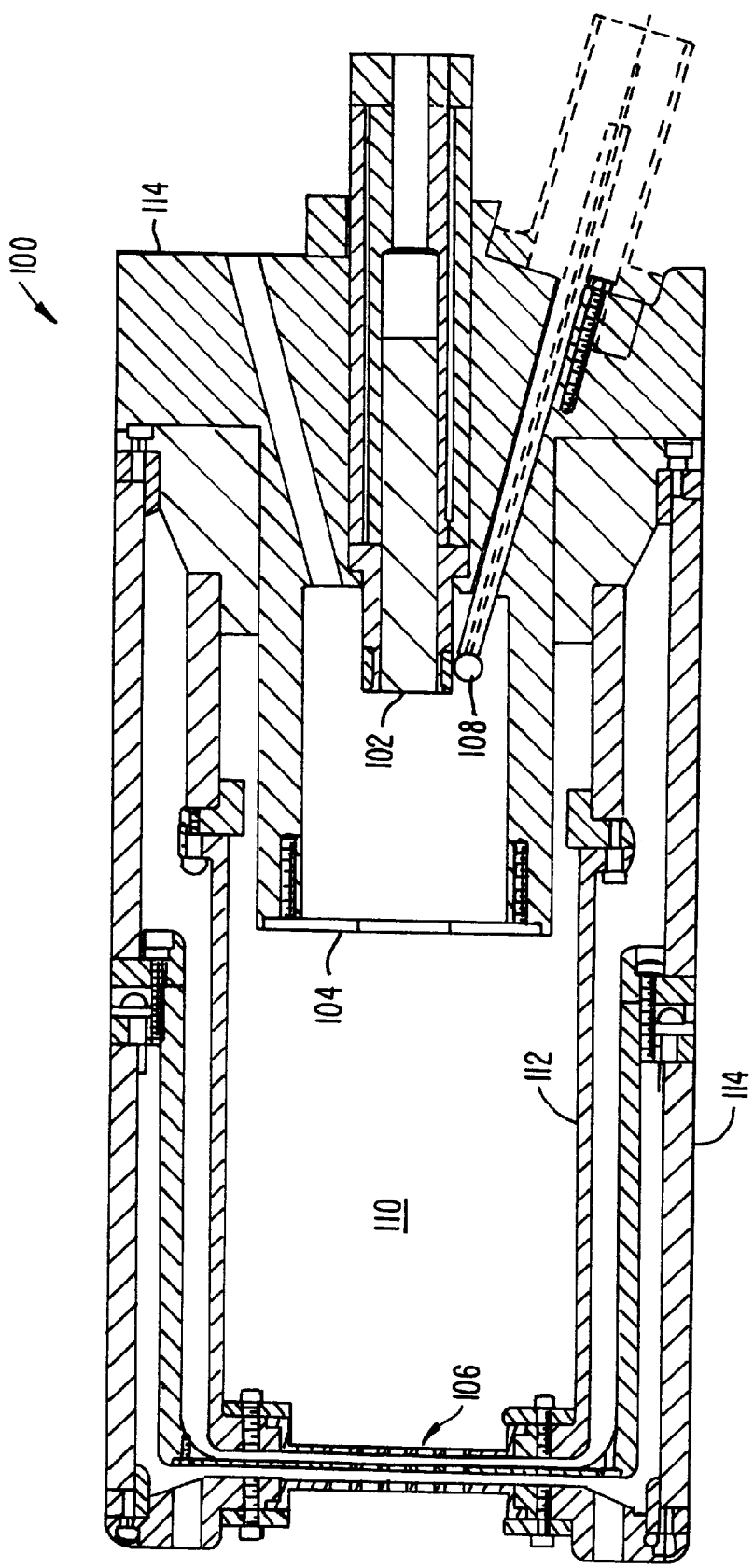
FIG. 3 is a simplified cross-sectional view of an exemplary metal vapor vacuum arc implanter that can be used to implant ceramic components with rare-earth metals according to one embodiment of the present invention.

FIG. 3 is a simplified cross-sectional view of an exemplary MEVVA™ ion implanter 100 that can be used to implant ceramic components with rare-earth metals according to this embodiment of the present invention. Implanter 100 includes a cathode 102 of the desired metal atoms or alloy to be implanted, an anode 104, a plasma extractor 106, a trigger 108, a cavity 110, and an insulative bushing 112 all surrounded by an outer frame 114.

The vacuum arc is a plasma discharge that takes place between cathode 102 and the grounded anode 104. The plasma is generated at a number of tiny points on the surface of the cathode, called cathode spots and at a dimension of few microns. The arc is concentrated to an extremely high current density, in the order of $10^8$–$10^{12}$ Å/cm$^2$. The metal ions are extracted from the plasma using perforated extraction grids 106 which are polarized at appropriate conditions to accelerate the extracted ions toward the ceramic component target. Such MEVVA™ ion sources are very efficient, as plasma preparation schemes go, and do not require a background gas—the plasma generation process is neither an evaporative nor a sputtering process. A more detailed description of a MEVVA™ ion implanter similar to the one shown in FIG. 3 is in U.S. Pat. No. 5,013,578 issued to Ian Brown et al. The '578 patent is hereby incorporated by reference in its entirety.

In the past, these implanters have typically been used for metal surface treatment in the automotive industry (e.g., piston surface treatment) and the tooling industry for increased hardness. One limitation of such commercially available implanters is, however, their anisotropy, e.g., the limitation to implant flat surfaces only. This is perfectly acceptable to implant the exposed face of flat ceramic heaters or electrostatic chucks, but it is a limitation in treating complex-shaped ceramic parts. The manufacturability of a commercially feasible MEVVA™ implanter based on a design similar to that shown in FIG. 3 has been established, however, in which large-area or complex-shaped parts could be treated in an industrial scale, high dose implanter. A description of such implanter is set forth by Ian Brown in Brown, et al., "Metal Ion Implantation for Large Scale Surface Modification," J. Vac. Sci. Tech., A 11(4), July 1993, which is hereby incorporated by reference in its entirety.

Figure 4:
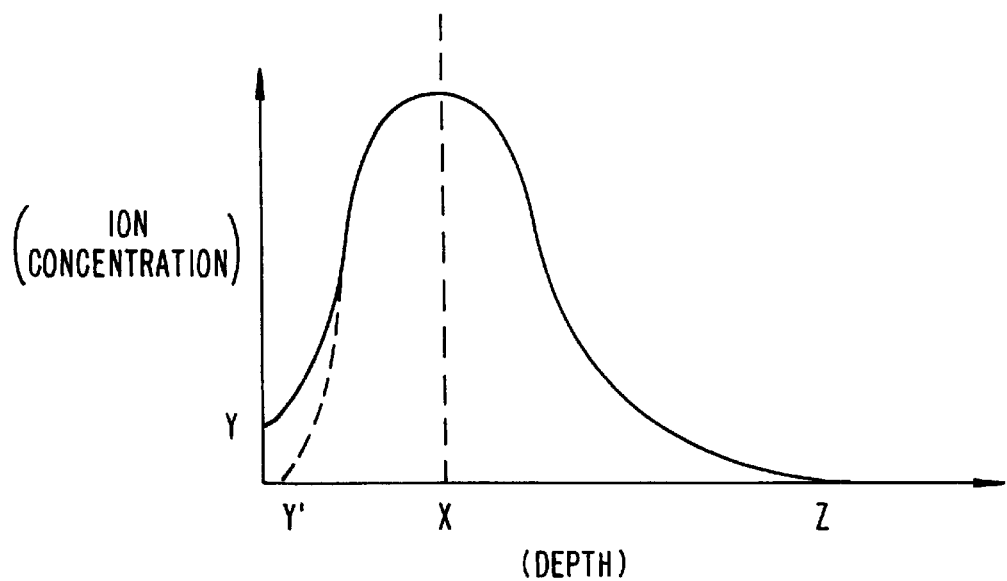
FIG. 4 is a graph illustrating rare-earth metal ion concentration versus depth in a ceramic component implanted with rare-earth ions using a metal vapor vacuum arc implanter similar to the one shown in FIG. 3.

When used to implant rare-earth ions into ceramic components according to the present invention, the use of such MEVVA™ ion implanters results in a surface treatment to the ceramic component as opposed to a coating technique or doping technique. The treated part includes a gradual interface that can have a surface profile similar to that shown in FIG. 4. FIG. 4 is a graph showing the concentration of rare-earth ions versus a function of depth of an implanted ceramic component. As shown in FIG. 4, the concentration of rare-earth ions has a peak at a depth of X and has an approximately Gaussian distribution around X such that the surface concentration of rare-earth ions is Y and the concentration reaches zero or background levels at a depth of Z. In some embodiments the surface concentration of rare-earth ions is essentially zero. In these embodiments, shown by the dashed line in FIG. 4, the concentration of rare-earth ions increases above background levels at a depth of Y' but still exhibits a Gaussian profile.

Because of the Gaussian profile, a gradual interface is obtained between the surface and the bulk of the material. Such a gradual interface provides a gradual transition of the surface properties such as physical, chemical properties and thermal dilatation and results in improved adherence as compared to more stepped profile distributions. Such a gradual interface also eliminates limitations of adherence due to thermal mismatch—a limiting factor in the case of corrosion resistant coatings that often have an abrupt interface. In such applications the protective coating deposited over chamber materials may crack during high temperature thermal cycles where the temperature change during and/or between various cycles can be as high 700° C. for ceramic heaters applications. Once such a crack is initiated in a corrosive environment, aggressive and corrosive free radicals may sneak through the film coating and erode the underlying wall material thereby causing film delamination and particulate contamination. Thus, in this respect, implanted structures have superior performance and versatility compared to plasma spray, CVD, laser ablation or PVD deposition techniques.

In another embodiment, metal plasma immersion techniques are used to treat the ceramic component. In this embodiment, a single or dual-source metal plasma ion immersion implantation and deposition (MEPIIID) source (another cathodic arc plasma source) is used to implant and deposit a layer of rare-earth ions over the ceramic component being treated. With this technique, a ceramic component to be treated is inserted into a plasma after the plasma has been deflected with a magnetic filter. The treated component is then alternatingly subjected to deposition and implantation by biasing the target with a negative pulsed voltage. When the target is unbiased, it is subject to a deposition phase of the treatment process and when it is negatively biased (e.g., at −50 kV), ions are accelerated toward the target so that it is subjected to an ion implantation phase. A more detailed description of a single-source MEPIIID system is set forth in U.S. Pat. No. 5,476,691 issued to Ian Brown et al., which is hereby incorporated by reference in its entirety. In a dual-source MEPIIID implanter the treatment process is similar to a single-source implanter process except that plasmas from two separate plasma guns are brought together through independent magnetic channels deposit a thin film over the ceramic component.

This embodiment requires that the part to be treated be biased to obtain implantation. This is not possible with ceramics which are poor conductors, however. This dilemma can be solved if there is an embedded electrode that can be biased within the component to be treated. Such is the case for heaters and ESCs.

Figure 5:
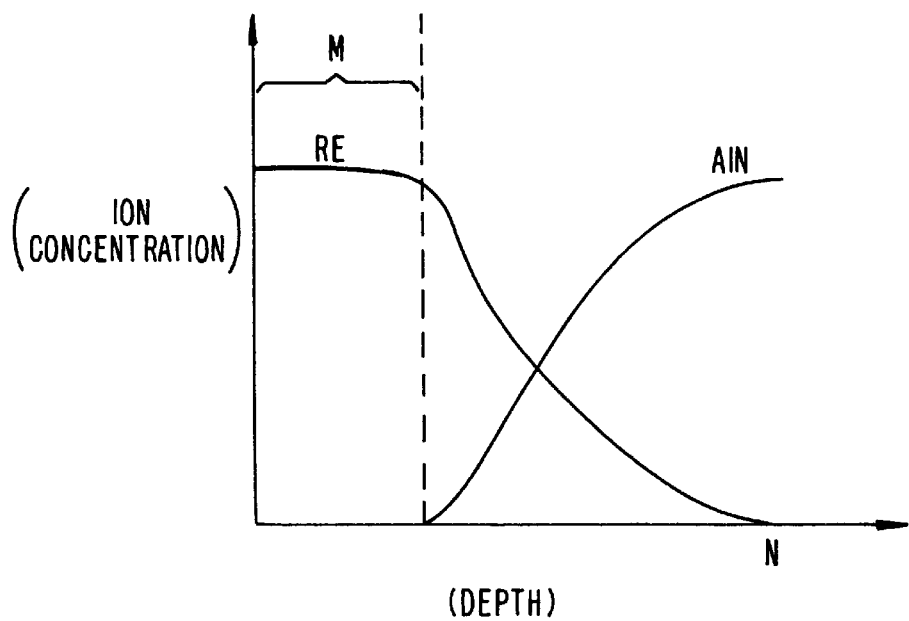
FIG. 5 is a graph illustrating the concentration of rare-earth ions at various depths of an aluminum nitride ceramic component treated with a metal plasma immersion technique.

FIG. 5 is a graph that shows the concentration of rare-earth ions and aluminum nitride at various depths of an aluminum nitride ceramic component treated with a metal plasma immersion technique. As can be seen in FIG. 5, the upper surface of the treated component is a layer M of rare-earth material formed from the deposition phases of the treatment process. Under layer M, the concentration of rare-earth ions decreases along the depth of the component until point N where the concentration of rare-earth ions is essentially zero (background levels). Because the MEPIIID implantation technique creates a discrete layer or stepped interface as opposed to a gradual interface, its use as an implantation technique is less desirable than a MEVVA or other implantation technique that creates such a more gradual interface.

Figure 6:
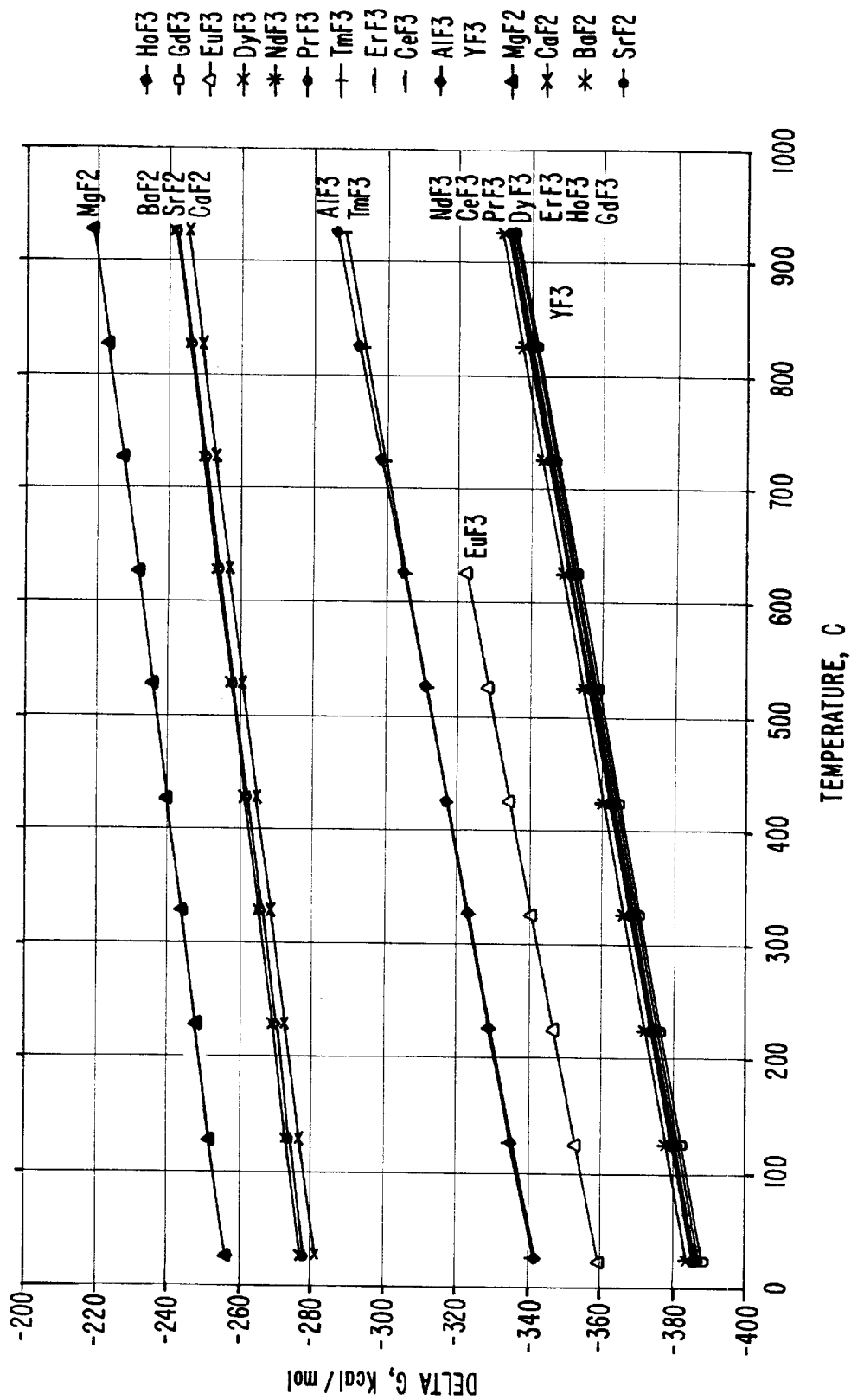
FIG. 6 is a graph illustrating the Gibbs free energy of formation of various metal fluorides.

Ceramic components manufactured according to the method of the present invention include rare-earth atoms at or near the outer surface of the components. When exposed to a highly corrosive environment such as a fluorine plasma, the rare-earth atoms react with fluorine ions in the plasma to form an $RE:F_3$ layer of material new the component's outer surface. The formation of an $RE:F_3$ material is more predominant than the formation of a less desirable $AlF_3$ layer because, as shown in FIG. 6, the Gibbs free energy of formation of various $RE:F_3$ materials such as $ErF_3$ and $CeF_3$ is lower than that of $AlF_3$. Once such a $RE:F_3$ layer is formed it acts as a passivation layer substantially reducing or even preventing the consumption of the ceramic part during further exposure to such highly corrosive environments and substrate processing.

III. Test Results and Measurements

To prove the effectiveness of the present invention, the inventor implanted a number of different ceramic coupons (AlN) with Er, Ce and Yb ions and exposed the implanted coupons to corrosive fluorine gases. In the tests, a multi-cathode (up 18 separate cathodes or cathode materials), repetitively pulsed MEEVA™ implanter with a 10-cm diameter extractor manufactured by Lawrence Berkeley National Laboratory was used. Repetitively pulsed operation of the source entailed parameters in the following range: arc current 100 A pulsed, arc voltage 20V, beam current 0.1–2 A pulsed, beam voltage 20–100 kV, beam energy 20–300 keV (the ion mean charge state can be from 1 to 3 depending on the metal ion species chosen).

For the rare earth implantation, a mean ion energy of 130–150 keV was chosen, the Ce, Er and Yb ions mean charge ($\overline{Q}_{ion}$) being respectively 2.1, 2.4, and 2.1. Three implantation doses were studied: $5 \times 10^{15}$ ions/cm$^2$ (representing approximately ×1 at.% ion concentration at the mean projected range), $1 \times 10^{16}$ ions/cm$^2$ (approximately 2.5 at.%) and $2 \times 10^{16}$ ions/cm$^2$ (approximately 5 at.%). At these energy levels, the projected range of RE ions in aluminum nitride ceramic material is typically 50 to 200 Å. With such a source, the typical time for an implantation of $1 \times 10^{16}$ ions/cm$^2$ is one hour—an acceptable processing time in production conditions.

The implanted coupons were then placed on an AlN ceramic heater, and heated to 650° C. in a Giga Fill SACVD chamber (manufactured by Applied Materials, the assignee of the present application) while being exposed to fluorine attack at 650° C. using a remote microwave $NF_3$ clean process. More than 1000 clean cycles were performed (17 hours total plasma ON time). Unimplanted coupons were analyzed before and after exposure to corrosion to characterize the surface reaction, surface texture and composition and act as a base comparison for the implanted coupons. X-Ray Diffraction (XRD), Scanning Electron Microscopy (SEM), Near Edge X-Ray Absorption Fine Structure (NEXAFS), PhotoElectron Emission Microscopy (PEEM) and Rutherford Backscattering Spectroscopy (RBS) were used to characterize the resistance to corrosion. The results of these tests were then compared with the results of studies and other tests performed on ceramic materials that were not implanted with rare-earth ions according to the present invention.

Figure 7:
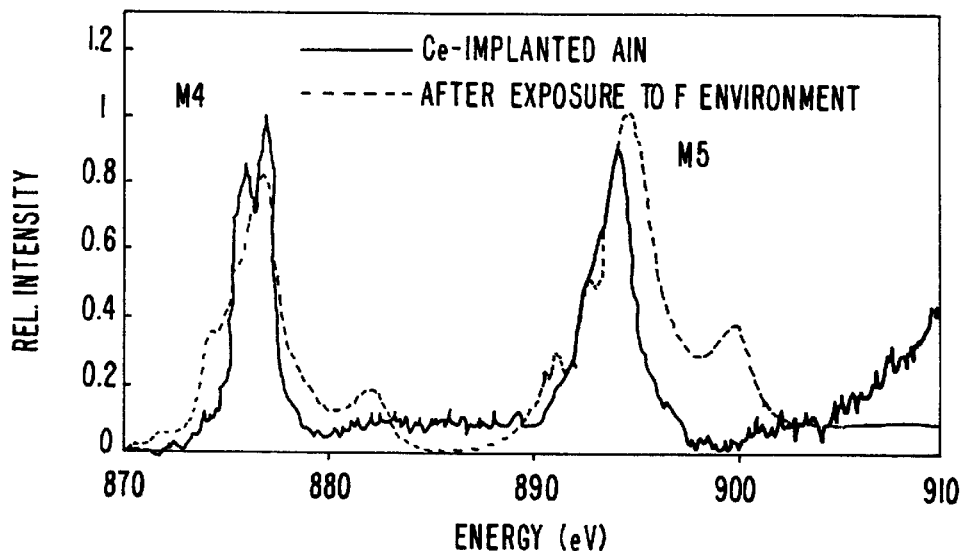
FIG. 7 is a NEXAFS spectra of Ce-implantation AlN coupons showing that the rare earth ions are in different bounding states before and after exposure to an $NF_3$ remote microwave clean.

The NEXAFS technique was used around the absorption edges of Er, Ce and Yb in the coupons (M4 and M5 lines in FIG. 7) to determine if a change in chemical-bound and local crystallographic environment occurred during fluorine exposure. The most important effect was observed in the case of the Ce implanted AlN samples, as can be seen in FIG. 7. The appearance of two additional peaks in the Ce absorption spectrum is probably due to a reaction of implanted Ce ions with the fluorine during exposure. For the Er and Yb samples, no new peak appeared but a shift of the fine structure energy was revealed.

Figure 8:
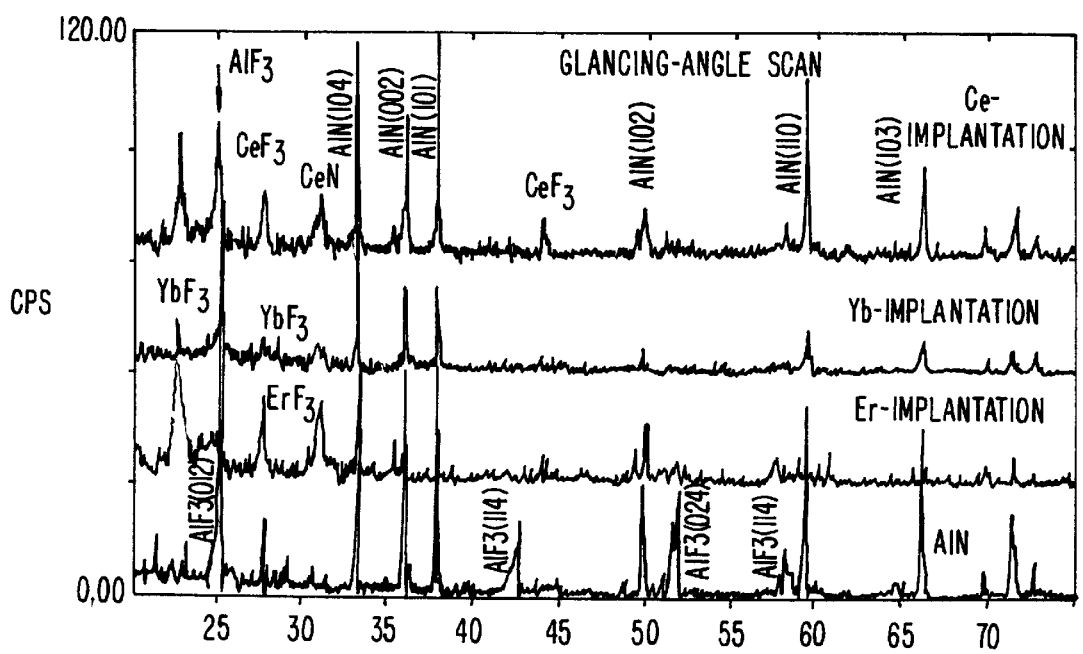
FIG. 8 is a XRD spectra of AlN and implanted AlN showing that no $AlF_3$ is formed in Er and Yb implanted samples and that instead a surface layer of $ErF_3$ and $YbF_3$ is formed.

Glazing angle XRD was used to characterize the resistance to corrosion after exposure to the $NF_3$ clean process. FIG. 8 shows the XRD spectra of the Ce, Er-, and Yb-implanted samples ($2 \times 10^{16}$ ions/cm$^2$) and compares them to the reference spectrum of unimplanted AlN. As evident in FIG. 8, after exposure to fluorine corrosion, the formation of $CeF_3$, $ErF_3$ and $YF_3$ can be observed in the implanted samples. This is a very positive result, as the goal of the process is to form a layer of fluorine material that can better passivate the surface that the $AlF_3$ film than is formed at the surface of the unimplanted sample.

Moreover, it is also evident in FIG. 8 that the formation of $AlF_3$ is prevented or reduced in the case of the Er- and Yb-implanted samples. For the Er-implanted samples, the $AlF_3$ signal has been reduced by a factor approximately 20 (if it is detectable at all), compared to the unimplanted coupons after exposure. For the Ce-implanted AlN, a mixture of $AlF_3$ and $CeF_3$ was detected. If a stable, durable layer of $ErF_3$ or $YbF_3$ is formed at the surface of AlN without the formation of $AlF_3$, then the problem of $AlF_3$ sublimation at temperatures greater than 600° C. is solved. The formed layer of $ErF_3$ or $YbF_3$ should resist temperatures up to at least 1000° C. The Ce-implanted sample resulted in a mixture of $AlF_3$ and $CeF_3$, a condition that is still improved over only $AlF_3$ function.

Figure 9:
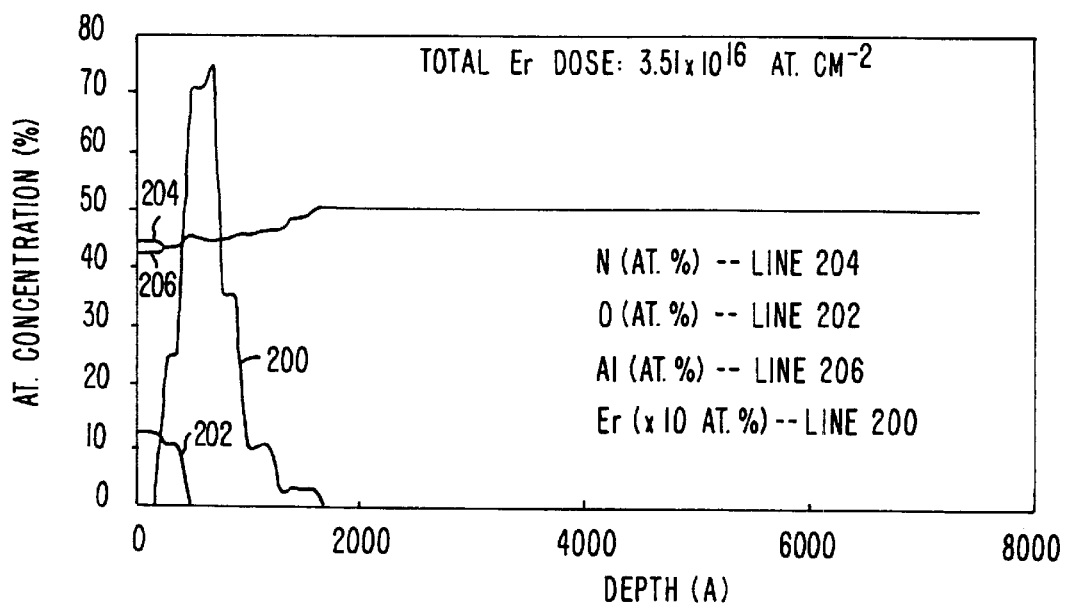
FIG. 9 is an RBS graph of an AlN coupon implanted with erbium atoms according to one embodiment of the method of the present invention.

FIG. 9 is a graph showing the actual rare-earth ion concentration in an AlN coupon implanted with a $3.51 \times 10^{16}$ ions/cm$^2$ dose of erbium in another experiment performed by the inventor as measured by RBS analysis. As can be seen in FIG. 9, the erbium concentration (line 200 representing 10 at.%) exhibits a substantially Gaussian profile between a depth of approximately 200 Å to 1500 Å with practically no erbium atoms penetrating the coupon below about 1700 Å. At depths below about 1700 Å, the coupon contains about 50% aluminum (line 206) and 50% nitrogen (line 204). A small amount of oxygen due to oxidation is found near the coupon's surface (line 202).

Figure 10:
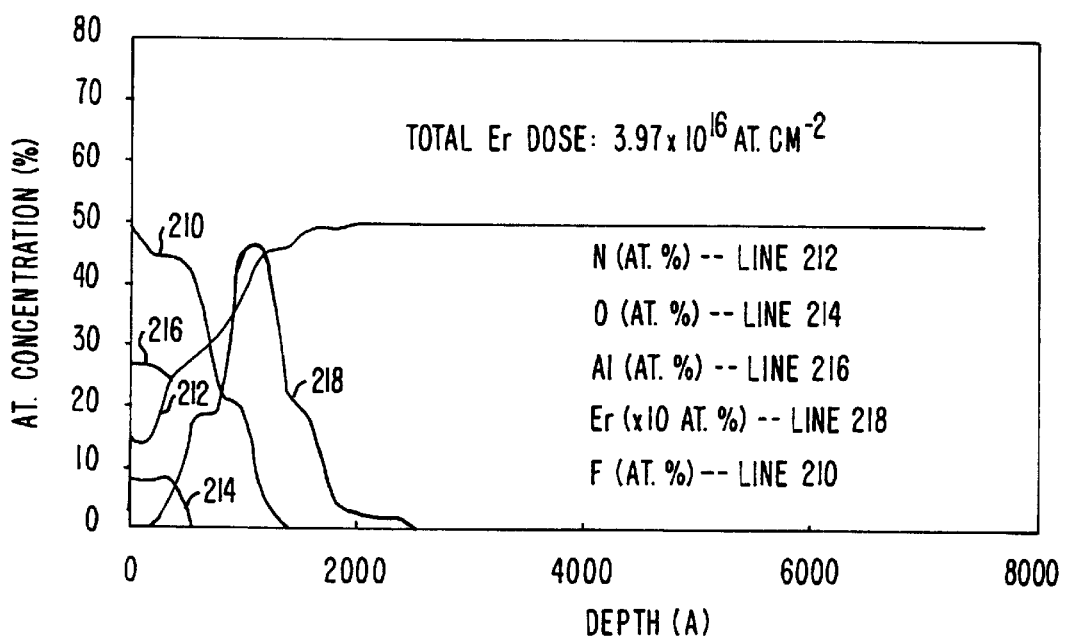
FIG. 10 is an RBS graph of the coupon in FIG. 9 after exposure to an $NF_3$ plasma.

FIG. 10 is a graph showing RBS measurements of the implanted coupon of FIG. 9 after the coupon was exposed to 17 hours of an $NF_3$ clean at 650° C. As evident in FIG. 10, a layer of fluoride material (a mixture of $AlF_3+ErF_3$ or $Al_{1-x}Er_xF_3$) forms at the surface of the coupon but is confined to the upper 1500 Å. No fluorine (line 210) is detected in the bulk of the coupon thus confirming that the rare-earth material acts as a barrier to the fluorine atoms. In FIG. 10, line 212 represents nitrogen, line 214 oxygen, line 216 aluminum and line 218 erbium times 10.

Figure 11:
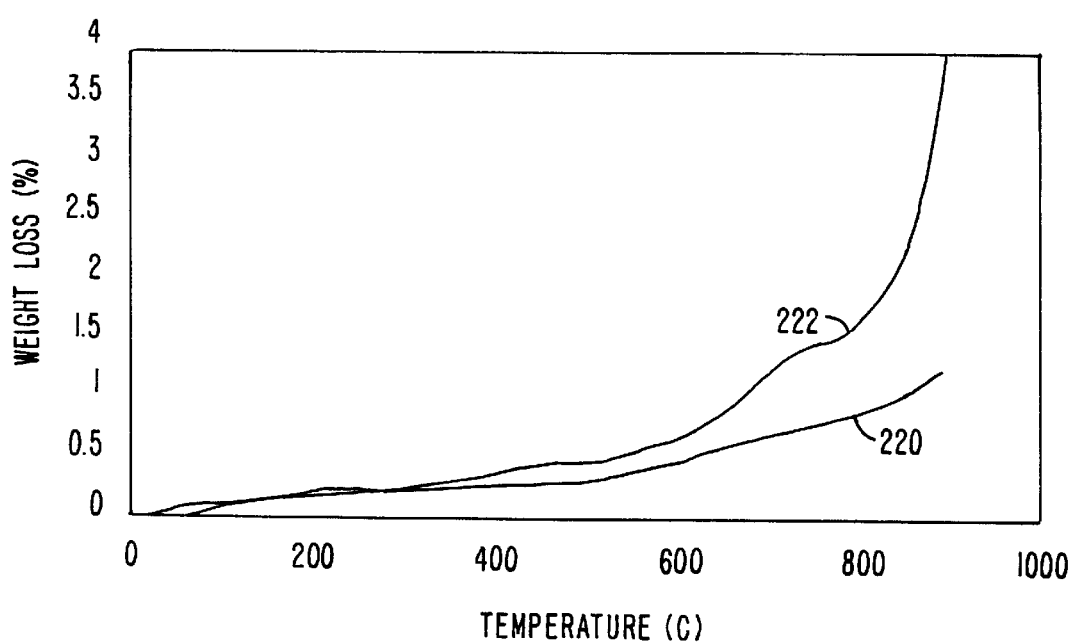
FIG. 11 is a TGA analysis graph comparing the percent weight loss of $ErF_3$ and $AlF_3$ powder samples as the samples are heated to about 900° C.

In still another test a thermal weight loss test was performed using TGA analysis on $AlF_3$ and $ErF_3$ powders. The test was performed by heating the samples at 5° C./min in a 30 mTorr vacuum chamber from 100 m temperature to above 900° C. The results of the test are shown in FIG. 11 and indicate that there is less than a 1% weight loss for $ErF_3$ at temperatures up to 850° C. (line 220). FIG. 11 also indicates that the resulting weight loss of $ErF_3$ is significantly better than the weight loss of $AlF_3$ (line 222) at temperatures above about 550° C. The difference in these weight loss values indicate that $AlF_3$ is consumed at a much higher rate at high temperatures than is $ErF_3$.

In summary, it has been shown that the Er and Yb implanted samples present much improved resistance to corrosion as compared to unimplanted samples. Indeed, the F radicals react with the implanted species to form $ErF_3$ and $YbF_3$ passivation layers at the surface of the ceramic, and the formation of $AlF_3$ can be prevented. The Ce implanted samples were also an improvement as compared to unimplanted ones, however, Ce is a less preferred rare-earth ion to implant than Er and Yb.

Having fully described several embodiments of the present invention, many other equivalent or alternative embodiments of the present invention will be apparent to those skilled in the art. These equivalents and alternatives are intended to be included within the scope of the present invention.

What is claimed is:

1. A substrate processing chamber having at least one ceramic component implanted with rare-earth ions.

2. A substrate processing chamber of the type used in the fabrication of integrated circuits, said chamber having at least one ceramic component implanted with rare-earth ions in a non-stoichiometric condition.

3. The substrate processing chamber of claim 2 wherein said rare-earth ions are selected from the group of: erbium, ytterbium and cerium.

4. The substrate processing chamber of claim 2 wherein said rare-earth ions are selected from the group of erbium and ytterbium.

5. The substrate processing chamber of claim 2 wherein said at least one ceramic component is one of a chamber liner, a chamber dome, a cover plate, a gas manifold or faceplate or a substrate holder.

6. The substrate processing chamber of claim 5 wherein said substrate holder comprises at least one of a high temperature heater or an electrostatic chuck.

7. The substrate processing chamber of claim 2 wherein said ceramic component is implanted with rare-earth ions from a high energy, high dose implantation technique using an implantation dose of about $5\times10^{15}$ ions/cm² or higher.

8. The substrate processing chamber of claim 2 wherein said ceramic component is implanted with rare-earth ions from a cathodic arc plasma source.

9. The substrate processing chamber of claim 2 wherein said ceramic component is implanted with rare-earth ions from a metal vapor vacuum arc ion implanter.

10. The substrate processing chamber of claim 2 wherein a bulk of said at least one implanted ceramic component comprises aluminum nitride or aluminum oxide.

11. The substrate processing chamber of claim 2 wherein said rare-earth ions are implanted in only an outer strata of said at least one ceramic component.

12. The substrate processing chamber of claim 2 wherein an outer surface layer of said ceramic component comprises a layer of $RE:F_3$.

13. A ceramic component for use in a substrate processing chamber wherein an outer strata of said component comprises implanted rare-earth atoms in a non-stoichiometric condition.

14. The ceramic component of claim 13 wherein said component is one of a chamber lines, a chamber done, a cover plate, a gas manifold or faceplate or a substrate holder.

15. The ceramic component of claim 14 wherein said substrate holder comprises at least one of a high temperature heater or an electrostatic chuck.

16. The ceramic component of claim 14 wherein said substrate processing chamber is of the type used in the fabrication of integrated circuits.

17. A method for treating ceramic material used in a substrate processing chamber by implanting said ceramic material with rare-earth ions.

18. The method or claim 17 wherein said implanting is done with a high energy, high does implantation technique using an implantation dose of about $5\times10^{15}$ ions/cm² or higher.

19. The method of claim 17 wherein said implanting is done with a cathodic arc plasma source.

20. The method of claim 17 wherein said ceramic material is a ceramic component designed to be used in a semiconductor substrate processing chamber.

21. A method for fabricating an integrated circuit on a substrate, said method comprising:
   (a) placing said substrate in a substrate processing chamber having at least one ceramic component implanted with rare-earth ions; and
   (b) performing a substrate processing operation on said substrate in said chamber.

22. The method of claim 21 wherein, prior to placing said substrate in said substrate processing chamber, said at least one ceramic component is exposed to a corrosive fluorine environment such that a layer of $RE:F_3$ forms on an outer surface of said component.

23. The method of claim 21 wherein said substrate processing operation results in at least a portion of said chamber being heated to at least 550° C.

24. The method of claim 21 wherein, said prior to placing said substrate in said substrate processing chamber, an outer strata of said ceramic comprises rare-earth ions in a non-stoichiometric condition.

25. A substrate processing chamber of the type used in the fabrication of integrated circuits comprising at least one ceramic component implanted with rare-earth ions wherein said at least one ceramic component is one of a chamber liner, a chamber dome, a cover plate, a gas manifold or faceplate or a substrate holder.

* * * * *